(12) United States Patent
Hiroshi

(10) Patent No.: US 7,304,338 B2
(45) Date of Patent: Dec. 4, 2007

(54) SOLID-STATE IMAGE SENSOR AND METHOD FOR FABRICATING THE SAME

(75) Inventor: Iwata Hiroshi, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 50 days.

(21) Appl. No.: 11/096,925

(22) Filed: Mar. 31, 2005

(65) Prior Publication Data

US 2006/0086955 A1   Apr. 27, 2006

(30) Foreign Application Priority Data

Mar. 31, 2004   (JP)   ............... 2004-107904

(51) Int. Cl.
   *H01L 31/062*   (2006.01)
(52) U.S. Cl. ............... 257/292; 257/291; 257/E27.133
(58) Field of Classification Search ........ 257/291–292, 257/290, 233, 234, 258, E27.13, E27.133
   See application file for complete search history.

(56) References Cited

U.S. PATENT DOCUMENTS

| | | | |
|---|---|---|---|
| 6,051,857 A * | 4/2000 | Miida ................... | 257/292 |
| 6,448,596 B1 * | 9/2002 | Kawajiri et al. ........... | 257/292 |
| 6,476,371 B2 * | 11/2002 | Miida ................... | 250/208.1 |
| 6,504,194 B1 * | 1/2003 | Miida ................... | 257/292 |
| 6,656,777 B2 | 12/2003 | Miida | |
| 6,950,134 B2 * | 9/2005 | Miida ................... | 348/294 |
| 2001/0042875 A1 * | 11/2001 | Yoshida ................ | 257/291 |

FOREIGN PATENT DOCUMENTS

| | | |
|---|---|---|
| JP | 53-069526 | 6/1978 |
| JP | 07-30091 | 1/1995 |
| JP | 09-298308 | 11/1997 |
| JP | 2001-223351 | 8/2001 |
| JP | 2002-026303 | 1/2002 |
| KR | 2001-0062028 | 7/2001 |
| KR | 2002-0052791 | 7/2002 |

* cited by examiner

*Primary Examiner*—Shouxiang Hu
(74) *Attorney, Agent, or Firm*—David G. Conlin; David A. Tucker; Edwards Angell Palmer & Dodge LLP

(57) ABSTRACT

A solid-state image sensor in which a plurality of unit pixel portions, each including a light receiving area which generates electric charges by light irradiation and a transistor which outputs an electric signal in accordance with the light receiving area, are arranged in a two-dimensional array, in which: each of the unit pixel portions includes a first conductive type well region provided on a second conductive type semiconductor layer in a first conductive type substrate, a part of the first conductive type well region and a second conductive type semiconductor layer region laminated on a part of the first conductive type well region form the light receiving area; electric charge storage area for storing electric charges generated in the light receiving area is provided in the first conductive type well region to read out an electric signal in accordance with an amount of electric charges stored in the electric charge storage area from the transistor; and the second conductive type semiconductor layer region has a maximum impurity concentration portion in the depth direction of the first conductive type substrate is at a surface of the first conductive type substrate.

4 Claims, 9 Drawing Sheets

SOLID-STATE IMAGE SENSOR AND METHOD FOR FABRICATING THE SAME

This Nonprovisional application claims priority under 35 U.S.C. §119(a) on Patent Application No. 2004-107904 filed in Japan on Mar. 31, 2004, the entire contents of which are hereby incorporated by reference.

BACKGROUND OF THE INVENTION

1. Field of the Invention

The present invention relates to a solid-state image sensor used for video cameras, digital cameras, cell phones with built-in cameras, and the like, and a fabrication method thereof. More specifically, the present invention relates to a solid-state image sensor such as a MOS-type image sensor of a threshold voltage modulation type and a fabrication method thereof.

2. Description of the Related Art

Conventionally, CCD type image sensors, MOS type image sensors, and the like are known as solid-state image sensors for converting image light as an image signal into an electric signal. For example, MOS-type image sensors include light-receiving areas for generating electric charges by light irradiation (photodiode) and transistors for reading out the electric charges generated in the light-receiving areas as an electric signal (MOS transistor), which are both provided on a shared substrate. Such MOS-type image sensors consume less power compared to CCD-type image sensors. Moreover, they can utilize standard CMOS process techniques such as system LSIs. Thus, the MOS-type image sensors have the advantages that the cost can be reduced, and they can be generally used.

Recently, as ion implantation apparatuses have been developed, as disclosed in Japanese Laid-Open Publication No. 2002-26303, for forming impurity regions in light receiving areas of solid-state image sensors, maximum concentration portions in the substrate depth direction can be formed at desired positions. Thus, it is possible to control the concentration efficiently.

Japanese Laid-Open Publication No. 2001-223351 discloses MOS-type image sensors of a threshold voltage modulation type. The MOS-type image sensors of the threshold voltage modulation type can be fabricated by using the techniques described in Japanese Laid-Open Publication No. 2002-26303.

In the image sensors of the threshold voltage modulation type disclosed in Japanese Laid-Open Publication No. 2001-223351, MOS transistors and photodiodes are provided on the same substrate. Below gate electrodes of the MOS transistors, electric charge storage areas called hole pockets are provided. The electric charge storage areas have embedded structure so that electric charges generated in the light-receiving areas are stored for suppressing implantation of photo-generated electric charges to surface defectives of semiconductor layers in order to reduce noises. In photodiodes which are the light-receiving areas, the electric charges generated by light irradiation (holes) are stored in the electric charge storage areas. The threshold voltages of the MOS transistors are modulated in proportion to the amount of the stored electric charges. Accordingly, the MOS-type image sensors of the threshold voltage modulation type can read out a signal in accordance with the amounts of the electric charges stored in the electric storage areas. Thus, noises due to electric charges other than photo-generated electric charges and dark current can be maintained low.

The MOS-type image sensors of the threshold voltage modulation type disclosed in Japanese Laid-Open Publication No. 2001-223351 will be described with reference to FIGS. 6 and 7.

FIGS. 6A and 6B are schematic cross-sectional views for respectively illustrating a fabrication process for fabricating the MOS-type image sensors of the threshold voltage modulation type. In a MOS-type image sensor, a light-receiving receiving diode (photo diode) 60 and a MOS transistor 100 are provided on the same substrate. Hereinafter, only the main portions of the light-receiving receiving diode 60 and the MOS transistor 100 will be explained.

As shown in FIG. 6A, the conventional MOS-type image sensor of the threshold voltage modulation type includes a silicon substrate 50 including a p-type epitaxial semiconductor layer (hereinafter, referred to as a silicon substrate 50), and an n-type impurity region 58 corresponding to the photo diode 60 and a p-type impurity region 57 adjacent to the n-type impurity region 58, which are formed on the silicon substrate 50.

On the silicon substrate 50, an n-type layer 59 is laminated so as to cover the p-type impurity region 57 and the n-type impurity region 58. On the n-type layer 59, a p-type impurity region 54 and an n-type low-concentration impurity region 53 are laminated in this order in an area corresponding to the p-type impurity region 57 and the n-type impurity region 58. The laminated p-type impurity region 54 and the n-type low-concentration impurity region 53 are surrounded by n-type well separation regions 56 formed on the n-type layer 59.

In the silicon substrate 50 with the impurity regions formed therein, a gate insulation film 51 is formed so as to cover an entire surface of the silicon substrate 50. Then, on the gate insulation film 51, a gate electrode 52 of a ring shape in the MOS transistor 100 is formed at the position adjacent to the n-type well separation regions 56 in the area above the p-type impurity region 54. On a surface of the n-type low-concentration impurity region 53, the gate insulation film 51 remains as a remainder from a dry etching process for the gate electrode 52.

Next, as shown in FIG. 6B, by implanting ions with having the gate electrode 52 as a mask and the gate insulation film 51 as an implantation protection film, n-type impurity regions 55 to be a source region and a drain region of the MOS transistor 100 are formed. At this time, in the area of the light-receiving receiving diode 60, embedded structure for photo-generated electric charges are formed by forming the n-type impurity regions 55 on an upper surface of the p-type impurity region 54. The n-type impurity regions 55 have high concentrations, and are formed at a shallow position with respect to the surface of the silicon substrate 50. By forming the high-concentration n-type impurity regions 55 in the area of the light-receiving receiving diode 60 at the shallow position with respect to the surface of the silicon substrate 50, short-wavelength blue light which may be attenuated radically near the surface of the silicon substrate 50 can be received securely with a high intensity without attenuation of the strength.

FIG. 7 shows n-type impurity concentration distribution in the depth length from the surface of the silicon substrate 50 for the light receiving diode 60 fabricated as described above. The vertical axis in FIG. 7 indicates the impurity concentration. The horizontal axis in FIG. 7 indicates the distance (depth) from the surface of the silicon substrate 50.

As shown in FIG. 7, the n-type impurity regions 55 is formed to the position at the depth around 200 nm (0.2 μm) from the surface of the silicon substrate 50. The peak of the impurity concentration of the n-type impurity regions 55 is at the depth of 50 nm or less from the surface of the substrate.

In the conventional MOS transistor 100 of the threshold voltage modulation type, the impurity concentration region is formed to be shallow (thin) with respect to the surface of the light receiving diode 60 in order to securely receive the blue light which has a short wavelength and is radically attenuated near the surface at a high intensity without attenuating the intensity.

However, when a dry etching process for the gate electrode 52 is performed, the gate insulation film 51 remains on the surface of the silicon substrate 50, and there is a variance in the film thickness of the remaining gate insulation film 51. Thus, when the n-type impurity regions 55 of a surface portion of the light receiving diode 60 are formed by ion implantation, a variance may be generated in peak positions of the impurity concentration of the n-type impurity regions 55 due to the variance in the film thickness of the gate insulation film 51, which serves as an implantation protection film. A variance may also be generated in the embedding resistance with respect to the photo-generated electric charges in the light receiving diode 60.

Further, the gate insulation film 51 remains after the dry etching with the film thickness of about 300 angstrom. For forming n-type impurity regions 55 on the surface of the light receiving diode 60, it is necessary to perform ion implantation at a low energy. However, when there is gate insulation film 51 of about 300 angstrom, the distance from a surface of the gate insulation film 51 and the surface of the silicon substrate 50 becomes long. This cause problems that a variance in an ion implantation range when ions are implanted (ARp) becomes large and an extent of the impurity region in the depth length of the silicon substrate 50 becomes large.

Further, if an average range when ion implantation impurities are implanted is set to a position deep inside from the surface of the silicon substrate 50, implantation defects may be generated in the light receiving diode 60 and a surface leak current may be undesirably generated.

Moreover, when the gate electrode 52 is formed by using a plasma process, if plasma gives damage on an upper-most surface of the light receiving diode 60, a surface leak current due to surface defects may be undesirably generated.

SUMMARY OF THE INVENTION

According to one aspect of the present invention, there is provided a solid-state image sensor in which a plurality of unit pixel portions, each including a light receiving area which generates electric charges by light irradiation and a transistor which outputs an electric signal in accordance with the light receiving area, are arranged in a two-dimensional array, wherein: each of the unit pixel portions includes a first conductive type well region provided on a second conductive type semiconductor layer in a first conductive type substrate, a part of the first conductive type well region and a second conductive type semiconductor layer region laminated on a part of the first conductive type well region form the light receiving area; electric charge storage area for storing electric charges generated in the light receiving area is provided in the first conductive type well region to read out an electric signal in accordance with an amount of electric charges stored in the electric charge storage area from the transistor; and the second conductive type semiconductor layer region has a maximum impurity concentration portion in the depth direction of the first conductive type substrate is at a surface of the first conductive type substrate.

In one embodiment of the present invention, a solid-state image sensor comprises an insulation film formed of a thermal oxidation film so as to cover the surface of the first conductive type substrate.

In one embodiment of the present invention, the insulation film has a film thickness set to 200 angstrom.

In one embodiment of the present invention, the transistor is a MOS-transistor.

According to another aspect of the present invention, there is provided a method for fabricating the above-described solid-state image sensor, comprising: forming a second conductive type semiconductor layer in each of the unit pixel portions in the first conductive type substrate, and forming a first conductive type well region on the second conductive type semiconductor layer; forming the electric charge storage area in the formed first conductive type well region; forming an insulation film so as to cover the surface of the first conductive type substrate; and ion-implanting impurities to the first conductive type substrate via the formed insulation film and forming a second conductive type semiconductor layer region in the light receiving area on the first conductive type well region, wherein implantation conditions are set in the step for implanting impurities such that a maximum concentration portion in the depth direction of the first conductive type substrate is at the surface of the first conductive type substrate.

In one embodiment of the present invention, implantation conditions are set in the step for implanting impurities such that an average range of impurity ions is within the insulation film.

In one embodiment of the present invention, a method for fabricating a solid-state image sensor further comprises, after the step for forming the electric charge storage area, forming a gate insulation film on the surface of the first conductive type substrate to form a gate electrode of the transistor, and then removing the gate insulation film in the areas except for the areas below the formed gate electrode, wherein an insulation film for covering the surface of the first conductive type substrate is formed after the step for removing the insulation film.

In one embodiment of the present invention, the insulation film covering the surface of the first conductive type substrate is a thermal oxidation film.

According to the present invention, a solid-state image sensor such as a MOS image sensor includes a plurality of unit pixel portions provided in a two-dimensional array. Each of the unit pixel portions includes a light receiving area, an electric storage area and a transistor. In such a solid-state image sensor, the maximum impurity concentration portion of a second conductive type semiconductor layer region of a surface of the light receiving area is at a surface of a first conductive type substrate. Thus, generation of implantation defects in the light receiving area is reduced and a surface leak current can be reduced. Further, since the surface-generated leak current due to the second conductive type semiconductor layer region is reduced in the surface of the first conductive type substrate of the light receiving area, the sensitivity to blue light having a short wavelength can be improved in the second conductive type semiconductor layer below the surface of the first conductive type substrate.

In the fabrication method for the solid-state image sensor according to the present invention, ion implantation is performed with having an insulation film such as thermal oxidation film as an implantation protection film so as to cover the substrate surface, and the second conductive type semiconductor layer region of the surface of the light receiving area is formed. Thus, a surface leak current due to surface defects on the surface of the light receiving area can be reduced, and the properties in the light receiving area can be improved. As a result, the sensitivity to blue light having a short wavelength can be improved.

Thus, the invention described herein makes possible the advantages of providing: a solid-state image sensor which can reduce defects generated by ion implantation in a light receiving area and can reduce a surface leak current due to photo-generated electric charges at a surface of the light receiving area; and a fabrication method thereof.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of a solid-state image sensor and a fabrication method thereof according to the present invention when applied to a MOS-type image sensor of a threshold voltage modulation type will be described with reference to the drawings. The solid-state image sensor of the present invention is not limited to a MOS-type image sensor.

Figure 1:
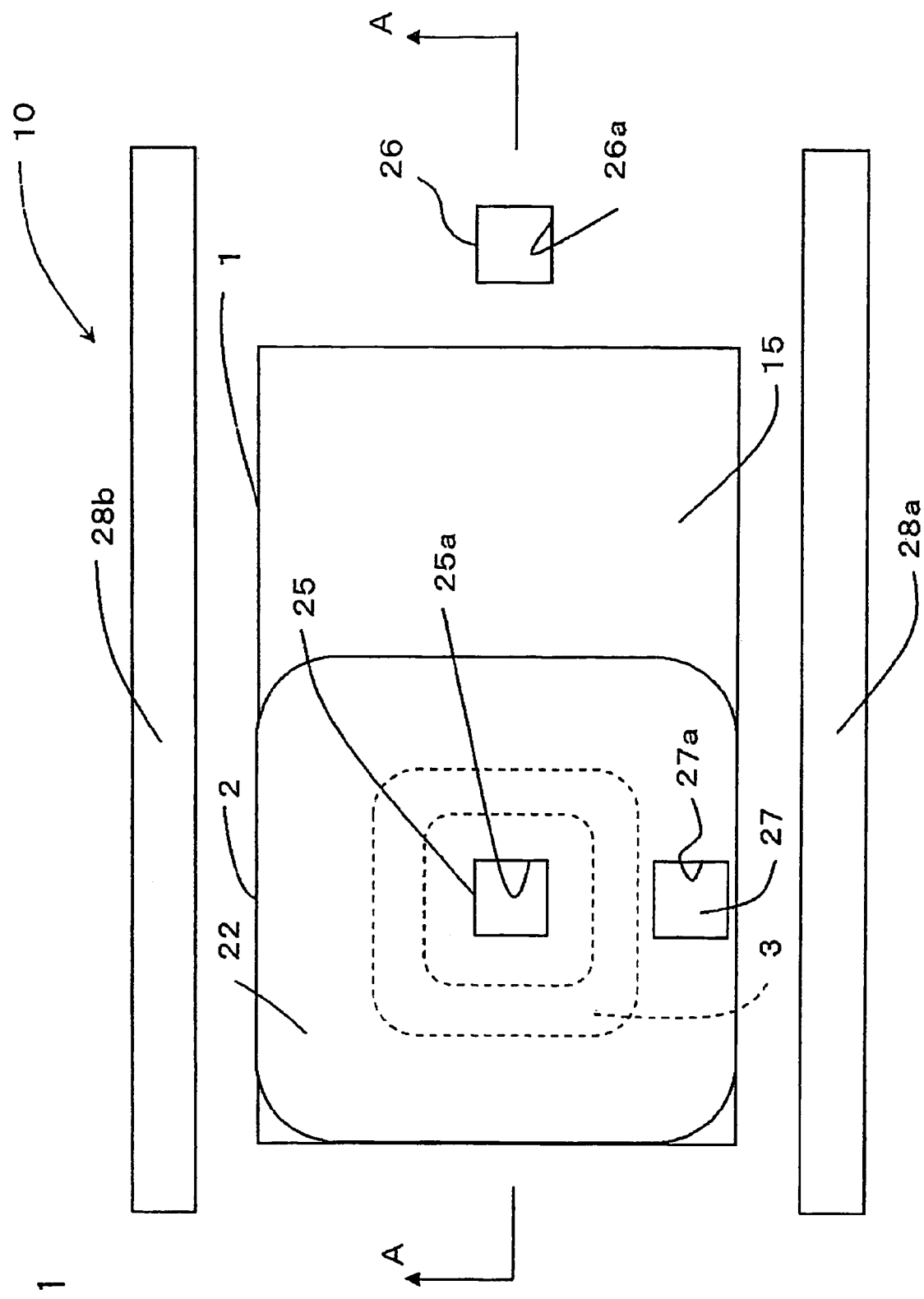
FIG. 1 is a plan view showing an exemplary layout of a unit pixel portion in one embodiment of a MOS-type image sensor according to the present invention.
Figure 2:
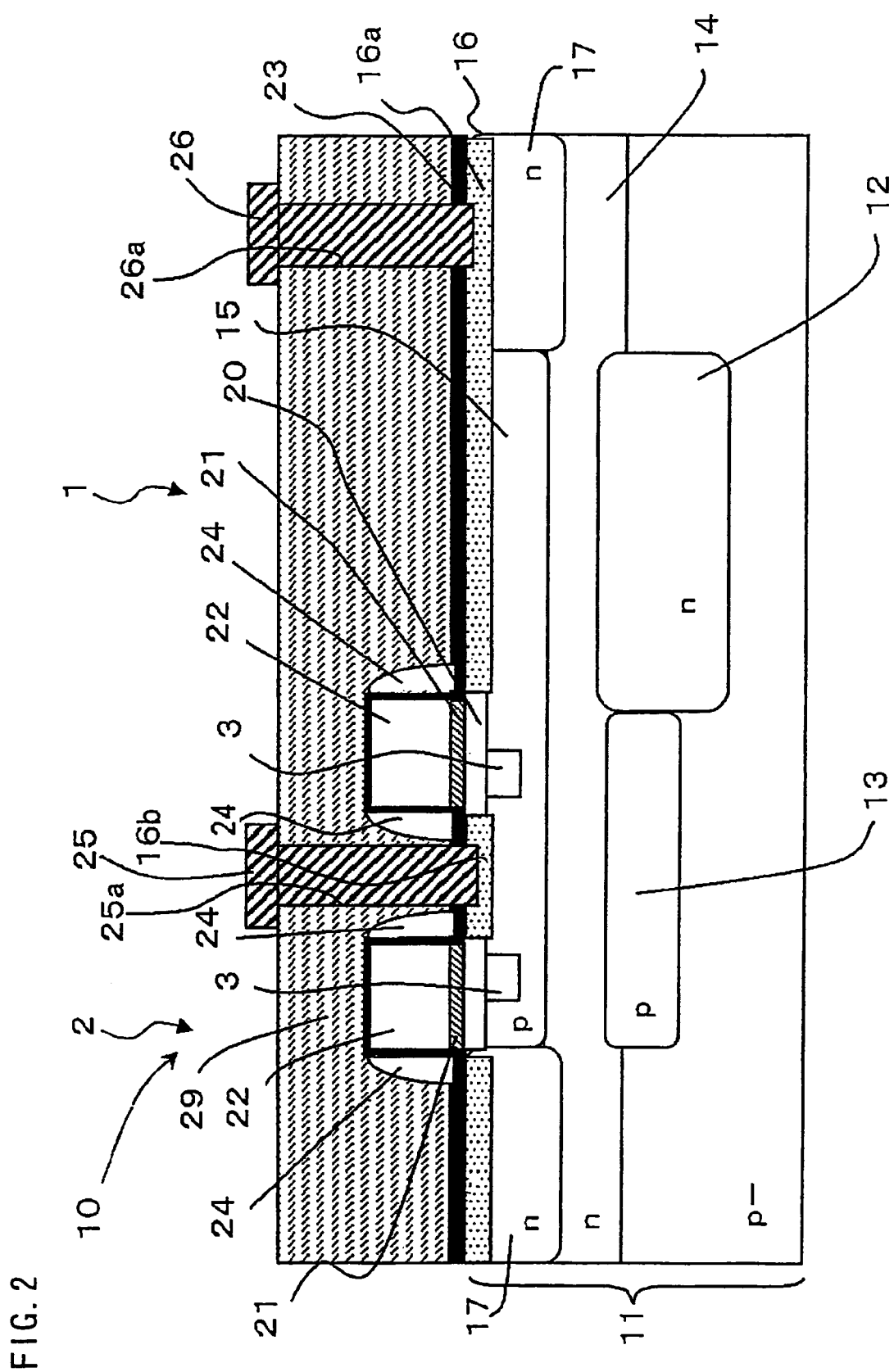
FIG. 2 is a cross-sectional view along A-A line in FIG. 1.

FIG. 1 is a plan view showing an exemplary layout of a unit pixel portion 10 in a MOS-type image sensor which is one embodiment of the solid-state image sensor according to the present invention. FIG. 2 is a cross-sectional view along A-A line in FIG. 1. Although not shown in FIGS. 1 and 2, in the MOS-type image sensor (solid-state image sensor), a plurality of unit pixel portions are arranged in a matrix (two-dimensional array) in a row direction and a column direction.

The unit pixel portion 10 of the MOS-type image sensor shown in FIGS. 1 and 2 includes: a light receiving diode (photodiode) 1 which is a light receiving area for photoelectric conversion; a MOS transistor 2 for detecting an optical signal which is provided adjacent to the light receiving diode 1; and a carrier pocket area (hole pocket area) 3 for storing electric charges which is provided below the MOS transistor 2. Further, inter-pixel separation electrodes 28a and 28b are respectively provided between the unit pixel portion 10 and adjacent unit pixel portions in the row direction. The pixel separation electrodes 28a and 28b are formed at the same time as a gate electrode 22 is formed, and separate the adjacent unit pixel portions 10 from each other.

As shown in FIG. 2, a silicon substrate 11 includes an n-type embedded layer 12 in an area where the light receiving diode 1 for photoelectric conversion is to be formed (the formation area for the light receiving diode 1). The silicon substrate 11 also includes a p-type embedded layer 13 adjacent to the n-type embedded layer 12 in an area where the MOS transistor 2 for optical signal detection is to be formed, which is adjacent to the formation area for the light receiving diode 1, (the formation area for the MOS transistor 2). An n-type layer 14 is provided across the entire surface of the silicon substrate 11 so as to cover the n-type embedded layer 12 and the p-type embedded layer 13.

On the n-type layer 14, a p-type well region 15 is provided in an area above the n-type embedded layer 12 and the p-type embedded layer 13 in the formation areas for the light receiving diode 1 and the MOS transistor 2. The p-type well region 15 is surrounded by n-type well separation areas 17. The n-type well separation areas 17 define the areas for forming the p-type well region 15. The p-type well region 15 on the side of the light receiving diode 1 makes a part of an electric charge generation area (light receiving area) to serve as a photoelectric conversion section. The p-type well region 15 on the side of the MOS transistor 2 for optical signal detection forms a transistor region of the MOS transistor 2.

On the p-type well region 15 and the n-type well separation areas 17, n-type high concentration diffusion regions 16 are provided except for some area in the transistor region of the MOS transistor 2. The n-type high concentration diffusion regions 16 are provided on the p-type well region 15, i.e., a region which generates photoelectric-converted signal electric charges in the light receiving diode 1. Thus, the p-type well region 15 has an embedded structure with respect to photo-generated electric charges because of the n-type high concentration diffusion regions 16.

The n-type high concentration diffusion region 16 serves as an n-type drain region 16a of the MOS transistor 2 on the area of the p-type well region 15 corresponding to the light receiving diode 1 and on the n-type well separation area 17 which surrounds the outer periphery of the p-type well region 15. The n-type high concentration diffusion region 16 serves as an n-type source region 16b of the MOS transistor 2 on the area of the p-type well region 15 which is near the n-type well separation area 17 adjacent to the MOS transistor 2. In an area of a ring shape surrounding the n-type source region 16b on the p-type well region 15, n-type channel dope layer 20 is provided instead of the n-type high concentration diffusion regions 16. The n-type channel dope layer 20 serves as a channel region in which current carriers move in the MOS transistor 2.

The n-type drain region 16a is electrically connected to the n-type layer 14 which is provided across the entire area of the unit pixel portion 10 via the n-type well separation areas 17 which are provided below.

On the n-type channel dope layer 20 provided into the ring shape surrounding the n-type source region 16b on the p-type well region 15, a gate electrode 22 is provided so as to have a ring shape with a gate insulation film 21 interposed therebetween. The gate insulation film 21 is removed except for the areas below the gate electrode 22. On the n-type high concentration diffusion regions 16 which serve as a surface of the silicon substrate 11, an insulation film 23 is provided. The insulation film 23 also covers the gate electrode 22 of the ring shape which is provided on the silicon substrate 11. Side surfaces of the gate electrode 22 of the ring shape are covered by side walls 24 provided thereon with the insulation film 23 interposed therebetween.

On the silicon substrate 11, an inter-layer insulation film 29 is formed across the entire surface. The inter-layer insulation film 29 covers the insulation film 23 and the side walls 24 which cover the gate electrode 22 of the ring shape. The n-type source region 16b provided in the center portion of the gate electrode 22 is connected to a source electrode 25 by a source contact hole 25a provided in the inter-layer insulation film 29. Further, the gate electrode 22 of the ring shape is connected to a gate electrode 27 by a gate contact hole 27a (see FIG. 1) provided in the inter-layer insulation film 29. Moreover, the n-type drain region 16a is connected to a drain electrode 26 by a drain contact hole 26a provided in the inter-layer insulation film 29.

In the p-type well region 15, the hole pocket area 3 is provided as a carrier pocket area for storing electric charges. The hole pocket area 3 is formed into a ring shape surrounding the n-type source region 16b as a high concentration embedded layer with the impurity concentration higher than that of the p-type well region 15. The hole pocket area 3 of the ring shape is provided to be in a concentric pattern with the gate electrode 22 of the ring shape to be provided above and to be near the side of the source electrode 25 surrounded by the gate electrode 22 (the center side). In the hole pocket area 3, electron holes (holes) which are optical signal carriers generated by light irradiation in the light receiving diode 1 are to be stored. In proportion to the amount of the optical signal carriers stored in the hole pocket area 3, the threshold of the MOS transistor 2 changes.

Operations of the MOS-type image sensor 10 having the above-described structure will be described below.

In the MOS-type image sensor 10 (solid-state image sensor) according to the present embodiment, a series of operations, i.e., an initialization operation, an electric charge storage operation, and a signal reading operation, is performed repetitively.

First, during the initialization operation, a high positive voltage is applied to the gate electrode 22, the source electrode 25 and the drain electrode 26. Then, optical signal carriers which remain in the hole pocket area 3 are discharged to a lower part of the silicon substrate 11 via the p-type embedded layer 13.

Next, during the electric charge storage operation, holes (electron holes) which are the optical signal carriers generated by light irradiation to the light receiving diode 1 are stored in the hole pocket area 3 below the gate electrode 22 via the p-type well region 15.

Then, during the signal reading operation, a signal in proportion to an amount of the optical signal carriers stored in the hole pocket area 3 is output from the source region 16b and is detected as a photo-electric conversion signal.

Hereinafter, the fabrication method of the MOS-type image sensor 10 according to the present embodiment will be described with reference to FIGS. 3A through 3K.

FIGS. 3A through 3K are cross sectional views respectively showing steps in a fabrication process for the MOS-type image sensor 10 of FIGS. 1 and 2. The cross sectional views correspond to the cross sectional view along A-A line in FIG. 1.

Figure 3A:
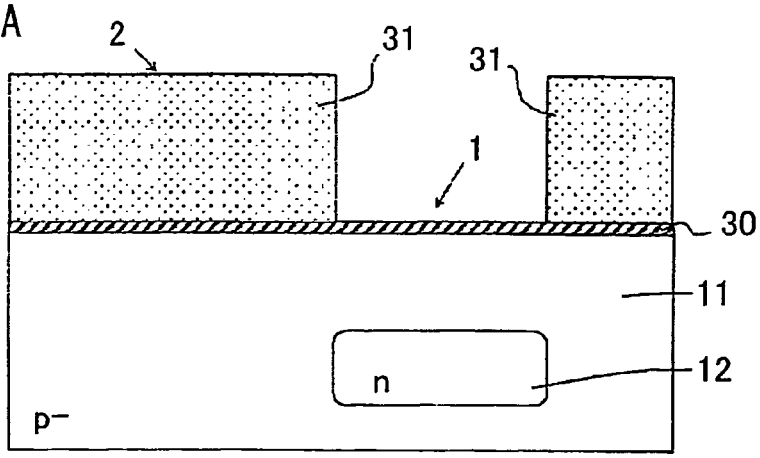
FIGS. 3A through 3K are cross sectional views respectively showing exemplary steps in a process for fabricating the MOS-type image sensor shown in FIG. 1.

First, as shown in FIG. 3A, a protection film 30 is formed across the entire surface of the silicon substrate 11. On the protection film 30, a mask pattern film 31 is laminated. Then, in the mask pattern film 31, an opening corresponding to the formation area for the light receiving diode 1 is formed. Through the opening, impurities are introduced to the silicon substrate 11. In the formation region for the light receiving diode 1, the n-type embedded layer 12 of the peak impurity concentration of about $1 \times 10^{17}$ cm$^{-3}$ is formed such that the peak position is at the depth of about 1.5 μm from the surface of the silicon substrate 11.

Figure 3B:
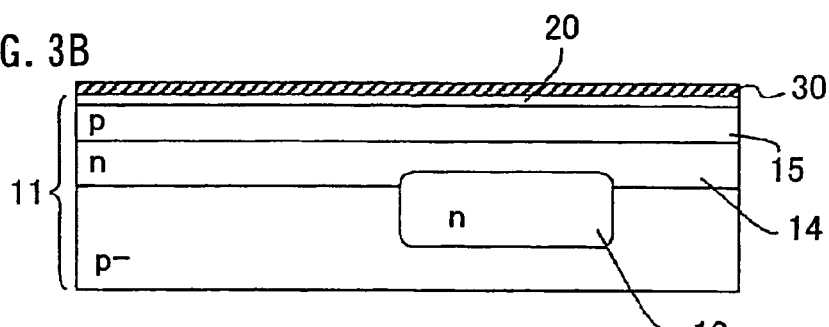

Next, as shown in FIG. 3B, the mask pattern film 31 is removed and n-type impurities are introduced across the entire area of the unit pixel portion 10. Accordingly, the n-type layer 14 is formed so as to cover the n-type embedded layer 12 of the light receiving diode 1. The n-type layer 14 is formed such that the peak impurity concentration is about $3 \times 10^{16}$ cm$^{-3}$ and the peak position is at about 0.7 μm from the surface of the silicon substrate 11. In this way, the n-type embedded layer 12 and the n-type layer 14 laminated covering the n-type embedded layer 12 are formed in the silicon substrate 11.

Then, with a mask pattern being provided on the areas above the inter-pixel separation electrodes 28a and 28b (see FIG. 1), p-type impurities are introduced across the entire surface of the silicon substrate 11. The p-type well region 15 is provided to be in contact with the n-type layer 14. N-type impurities are introduced to a surface side portion of the p-type well region 15. Thus, the n-type channel dope layer 20 is formed across the entire surface of the silicon substrate 11.

Figure 3C:
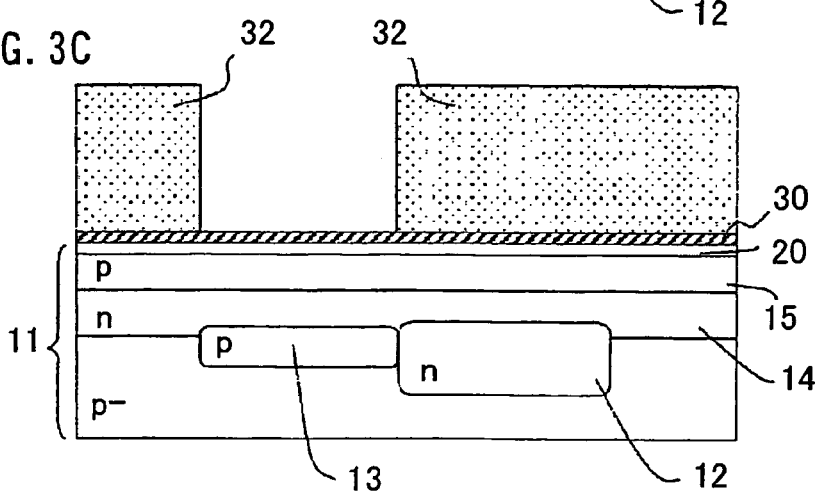

Next, as shown in FIG. 3C, a mask pattern film 32 is formed on the protection film 30. Then, an opening corresponding to a formation area for the MOS transistor 2 for optical signal detection is formed. Through the opening, P-type impurities for fixing a substrate potential are introduced to the same depth as the n-type embedded layer 12. The p-type embedded layer 13 having the impurity concentration higher than that of the n-type layer 14 is formed adjacent to the n-type embedded layer 12.

Figure 3D:
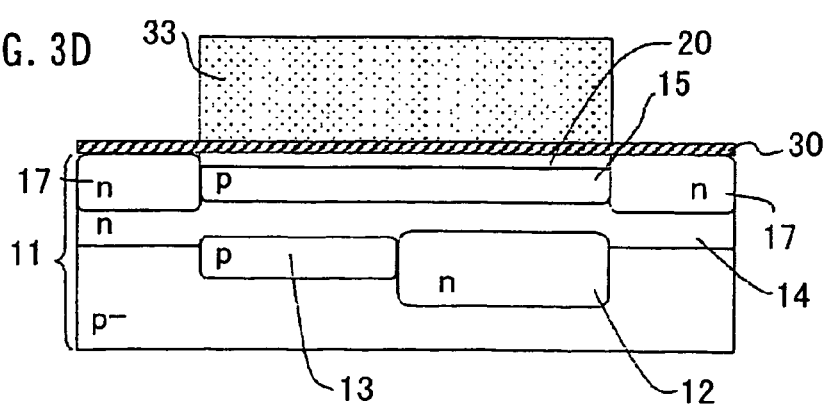

Then, as shown in FIG. 3D, a mask pattern 33 is provided on the protection film 30 so as to cover the p-type embedded layer 13 and the n-type embedded layer 12. With the areas except for the area above the p-type embedded layer 13 and the n-type embedded layer 12 being opened, n-type impurities are introduced to areas of the p-type well region 15 which surround the p-type embedded, layer 13 and the n-type embedded layer 12. Thus, the n-type well separation areas 17 which surround the p-type well region 15 and the n-type channel dope layer 20 are formed. In this way, the p-type well region 15 is separated by the n-type well separation areas 17 and the light receiving area which determines the sensitivity to an optical signal in the light receiving diode 1 is formed with a predetermined area.

Figure 3E:
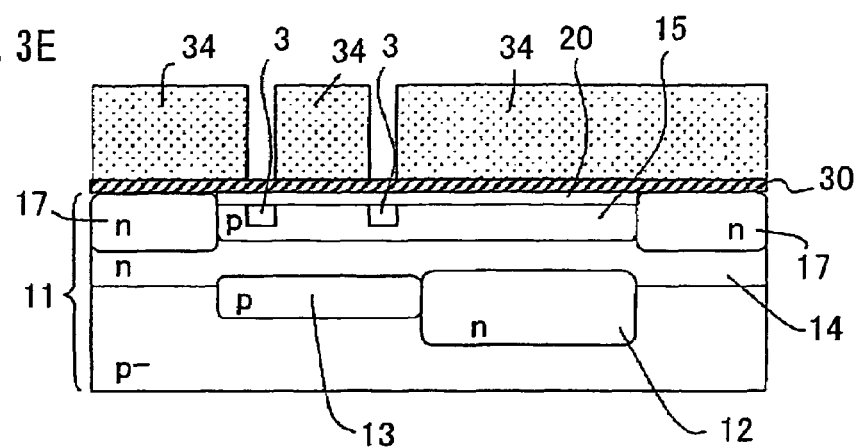

Then, as shown in FIG. 3E, a mask pattern 34 is laminated on the insulation film 30. The mask pattern 34 includes an opening of a ring shape corresponding to the hole pocket area 3 formed in the p-type well region 15 of the MOS transistor 2. Through the opening, p-type impurities are introduced into the p-type well region 15 of the MOS transistor 2. Thus, the hole pocket area 3 of the ring shape having the impurity concentration higher than that of the p-type well region 15 and the peak impurity concentration of about $1.4 \times 10^{17}$ cm$^{-3}$ is formed so as to have the peak position at about 0.15 μm from the surface of the silicon substrate 11.

Next, although not shown in the figures, the mask pattern 34 is removed, and then the surface of the silicon substrate 11 is thermal-oxidized across the entire surface to form the gate insulation film 21.

Figure 3F:
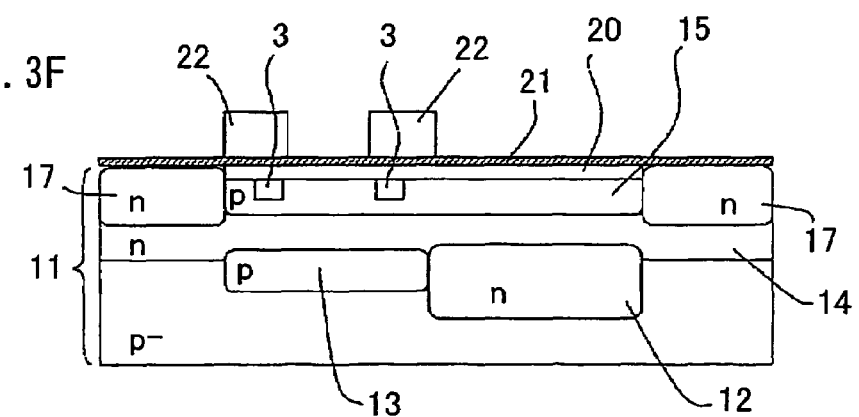

Thereafter, as shown in FIG. 3F, on the gate insulation film 21 above the hole pocket area 3, the gate electrode 22 of the ring shape, which has an area larger than the surface of the hole pocket area 3 and which covers the entire hole pocket area 3, is formed. The gate electrode 22 of the ring shape is provided to be in a concentric pattern with the hole pocket area 3 of the ring shape and such that the hole pocket area 3 is near the center side of the gate electrode 22.

Figure 3G:
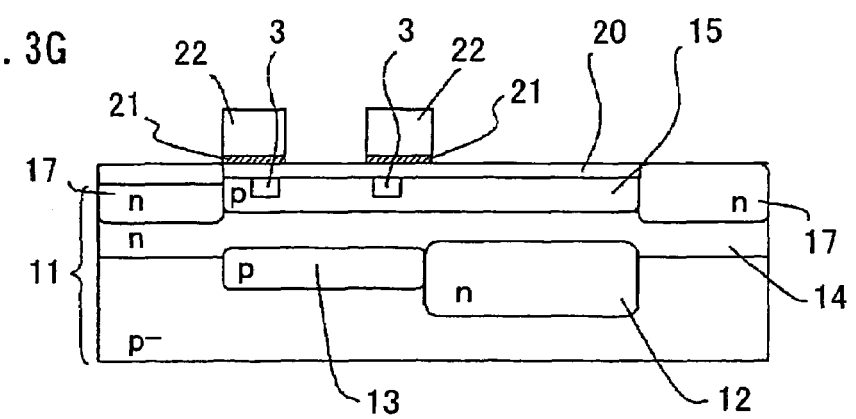

Then, as shown in FIG. 3G, the gate insulation film 21 is removed by a wet etching process to expose the surface of the p-type well region 15 and the surface of the n-type well separation areas 17. At this time, the gate insulation film 21 remains only in the area below the gate electrode 22 since etching is performed with the gate electrode 22 being used as a mask.

Figure 3H:
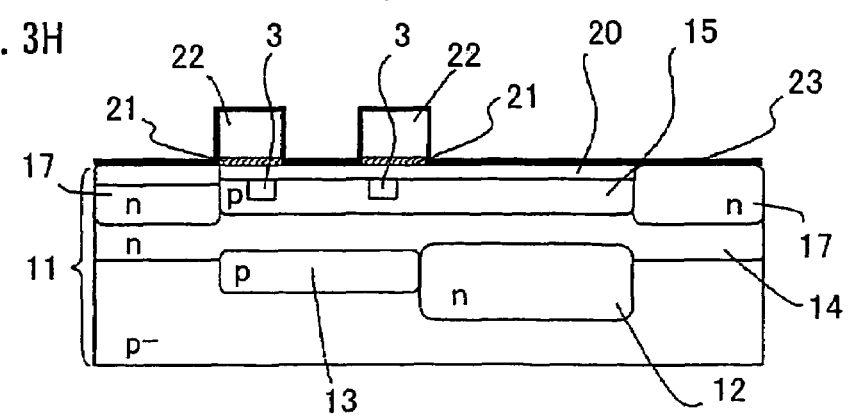

Next, as shown in FIG. 3H, the surface of the silicon substrate 11 is thermal-oxidized by dry $O_2$ oxidation at 800° C. across the entire surface to form the insulation film 23. The film thickness of the insulation film 23 at this time is about 200 angstrom. The film thickness variance across the entire surface of the p-type substrate 11 is controlled to be within about 5 angstrom. In such a case, the thermal-oxidation film 23 is formed on both the upper surface and side surfaces of the gate electrode 22. However, the thermal-oxidation film 23 does not affect the properties of the MOS transistor to be formed, while it provides a function as a protection film against plasma damages during a process for side walls provided on the side surfaces of the gate electrode 22.

Figure 3I:
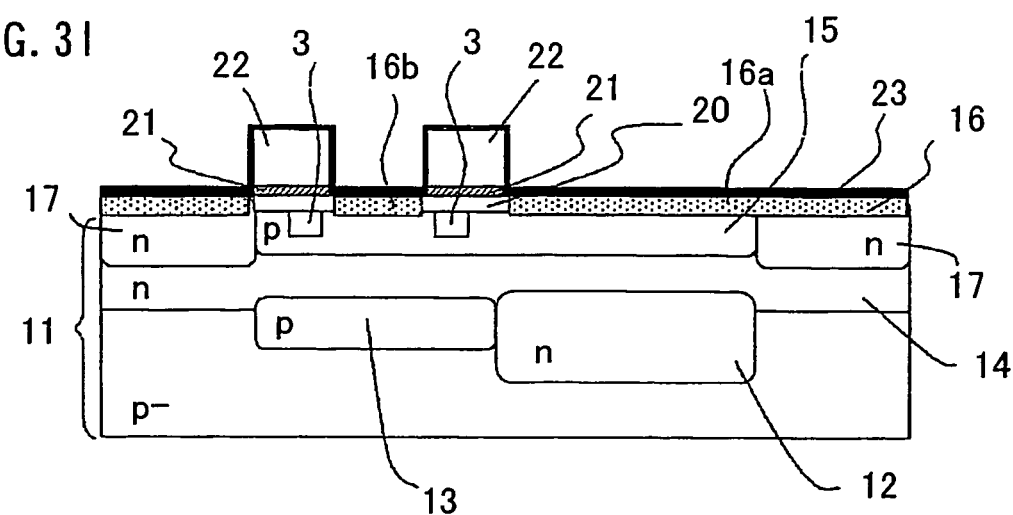

Then, as shown in FIG. 3I, with having the insulation film 23 as a protection film for ion implantation, and having the gate electrode 22 as a mask, n-type impurities are introduced to the entire surface of the silicon substrate 11. Thus, the n-type high concentration diffusion regions 16 are formed in surface layer portions of the silicon substrate 11 except for the areas where the gate electrode 22 is provided. At this time, the peak impurity concentration is set to be about $6 \times 10^{18}$ cm$^{-3}$ so that the average range of the ion implantation is within the insulation film 23. The maximum portion of the impurity concentration of the n-type impurity regions 16 is at the surface of the silicon substrate 11, i.e., the surface of the n-type impurity regions 16. The concentration thereof is about $3 \times 10^{18}$ cm$^{-3}$.

Figure 3J:
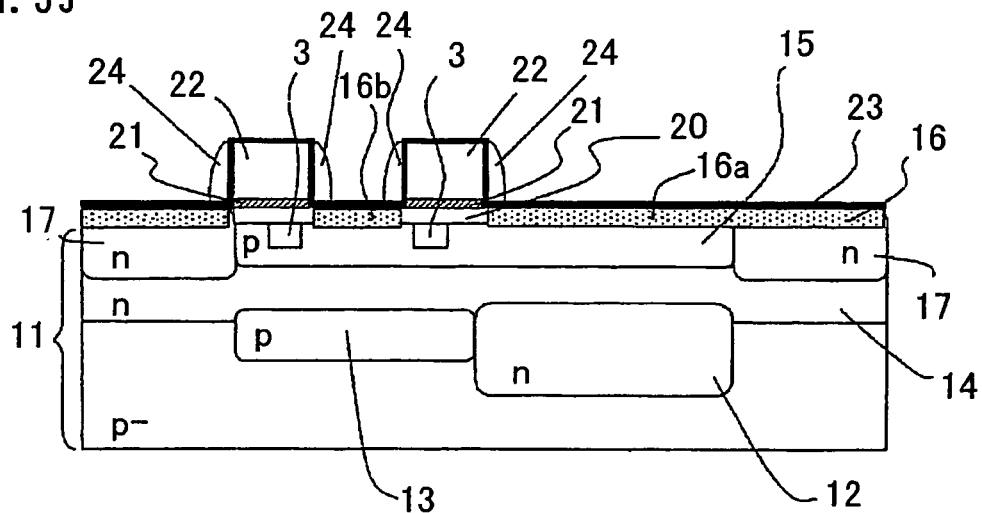

Next, as shown in FIG. 3J, a silicon oxidation film layer formed of $SiO_2$ for the side walls are formed across the entire surface of the silicon substrate 11. Then, a dry etching process is performed to form the side wall films 24 on side surface of the gate electrode 22.

Figure 3K:
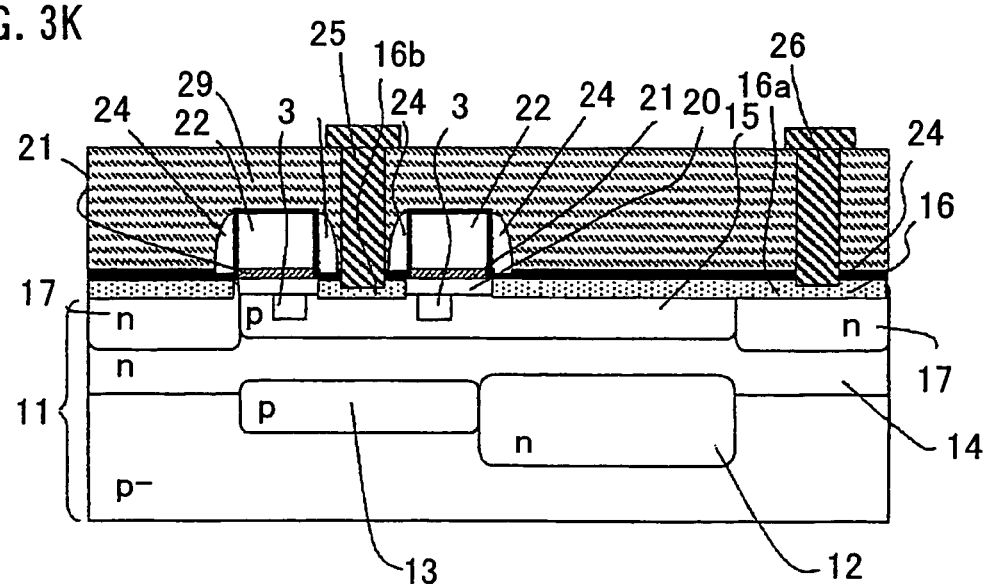

Then, as shown in FIG. 3K, the inter-layer insulation film 29 is formed across the entire surface of the silicon substrate 11. Then the contact holes 25a, 26a, and 27a are respectively formed in the source region 16b, the drain region 16a, and the gate electrode 22 to form the source electrode 25, the drain electrode 26 and the gate electrode 27.

In this way, the MOS-type image sensor according to the present embodiment is formed.

Figure 4:
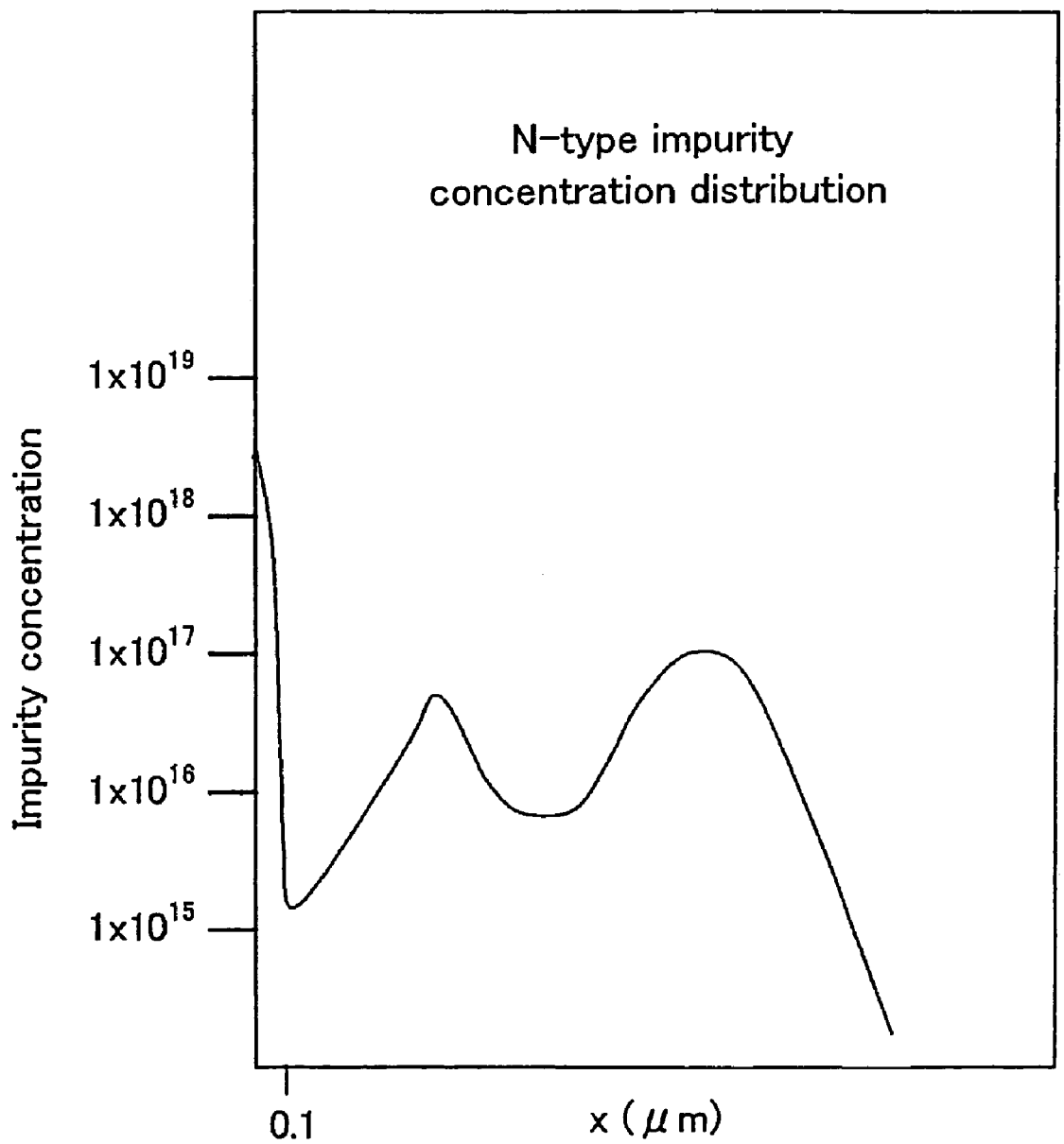
FIG. 4 is a graph showing n-type impurity concentration distribution in a light receiving diode according to the present invention.

FIG. 4 is a graph showing n-type impurity concentration distribution from the surface of the silicon substrate 11 in the light receiving diode 1 toward the depth direction in the MOS-type image sensor formed as described above. The vertical axis in FIG. 4 indicates the impurity concentration. The horizontal axis in FIG. 4 indicates the position from the substrate surface toward the depth direction.

As shown in FIG. 4, in the MOS-type image sensor according to the present embodiment, the thickness of the n-type high concentration diffusion regions 16 is about 100 nm and the peak position of the impurity concentration of the n-type high concentration diffusion regions 16 is at the upper-most surface of the silicon substrate.

Figure 5:
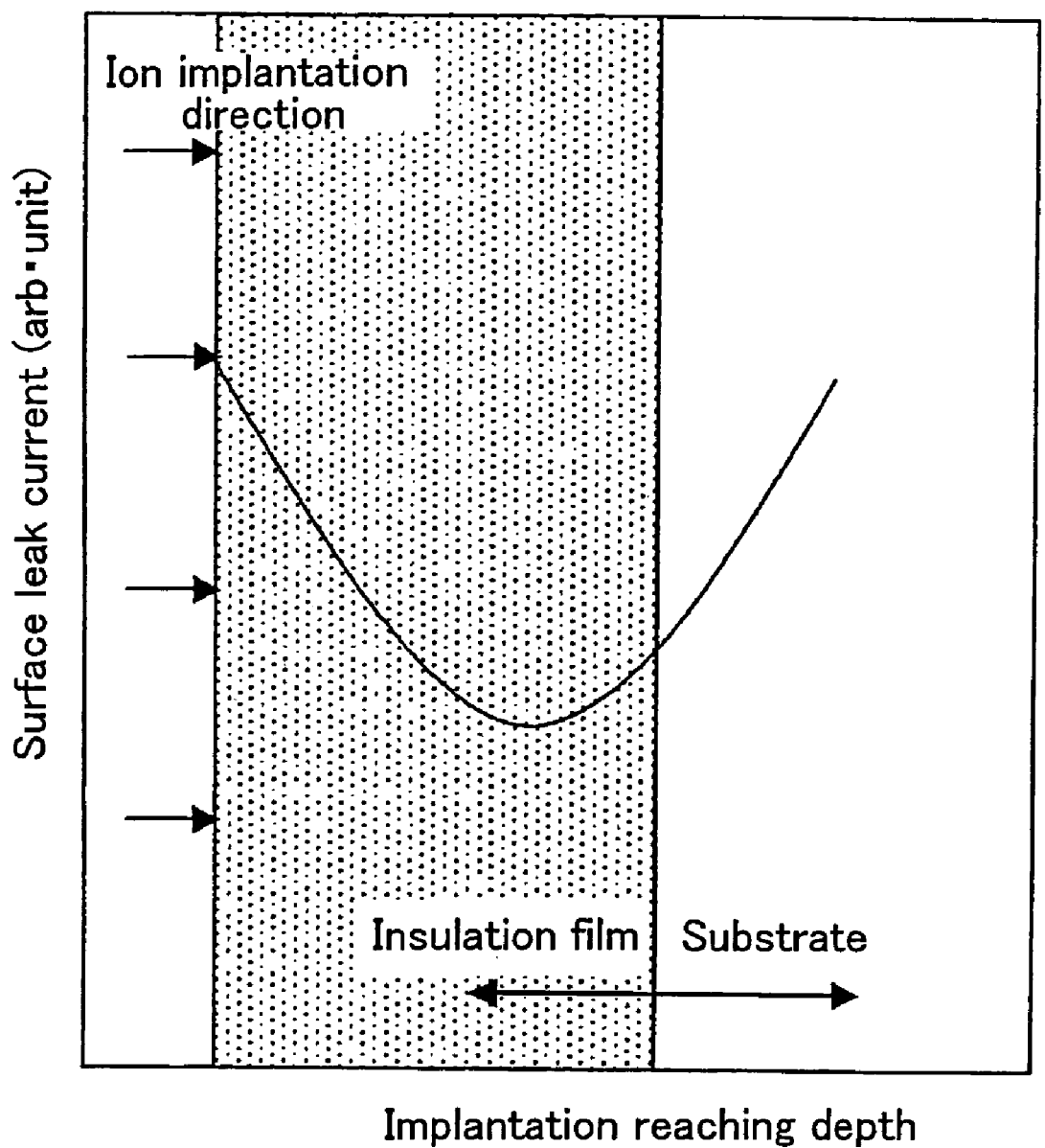
FIG. 5 is a graph showing a relationship between a surface-generated leak current and an implantation average range according to the present invention.
Figure 6A:
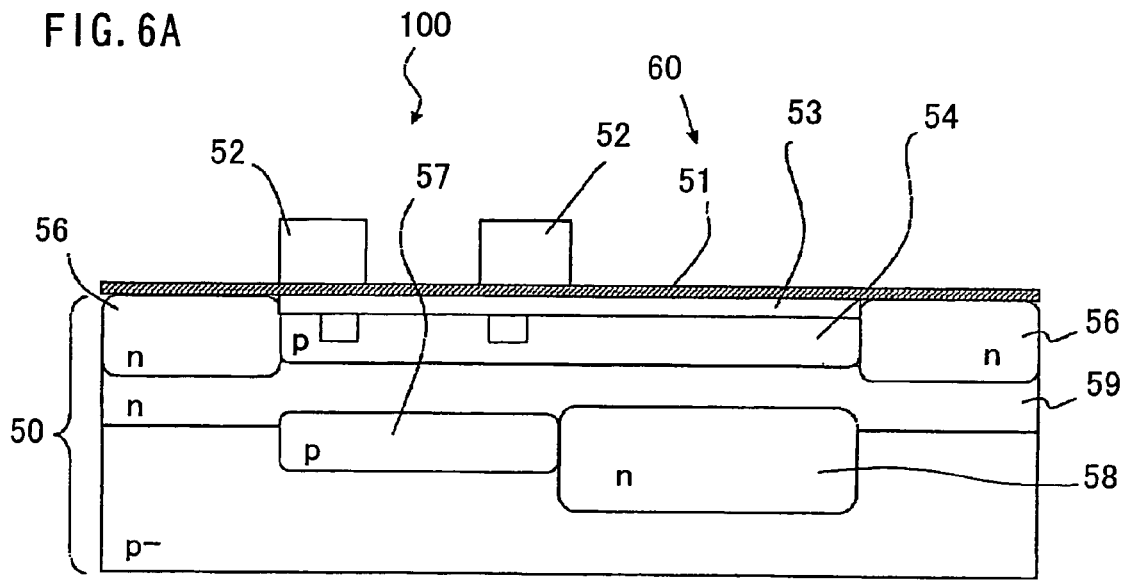
FIGS. 6A and 6B are cross sectional views respectively showing exemplary steps in a process for fabricating a conventional MOS-type image sensor.
Figure 6B:
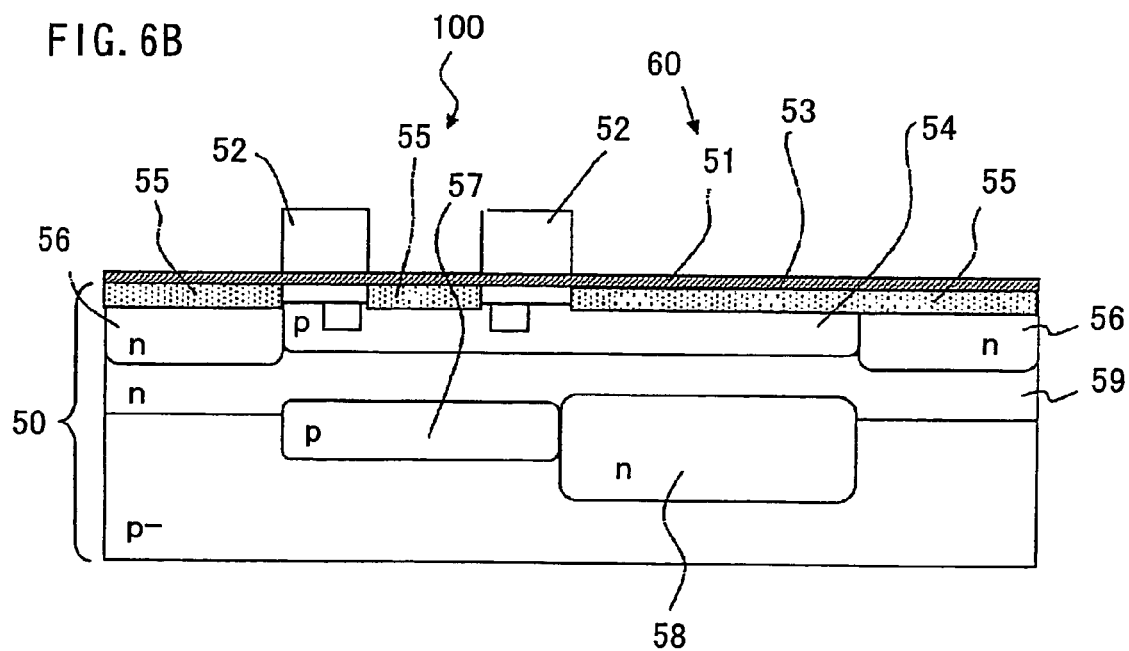
Figure 7:
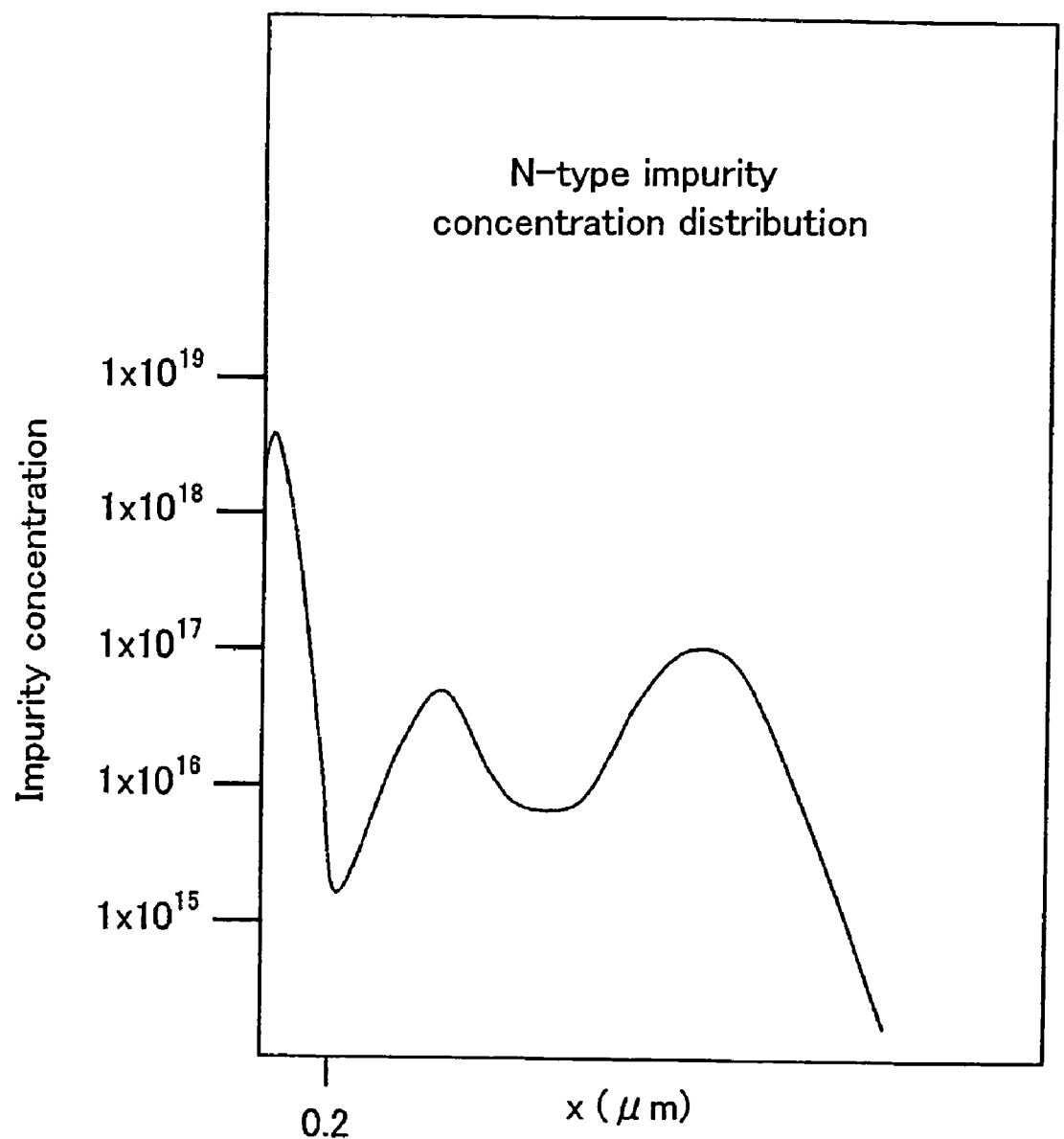
FIG. 7 is a graph showing n-type impurity concentration distribution in the conventional light receiving diode.

FIG. 5 is a graph showing a relationship between the average range of the ions to be implanted and a surface-generated leak current during an ion implantation process for forming the n-type high concentration diffusion regions 16. The vertical axis in FIG. 5 indicates the surface leak voltage. The horizontal axis of FIG. 5 indicates the average range (implantation reaching depth) of the ions to be implanted.

As shown in FIG. 5, when the average range is within the insulation film 23, the surface-generated leak current is at the minimum value.

As described above, according to the present embodiment, the MOS-type image sensor includes a plurality of the unit pixel portions 10 provided in a two-dimensional array. Each of the unit pixel portions 10 includes the light receiving diode (photodiode) 1 and the MOS transistor 2 having the electric charge storage area 3. In such a MOS-type image sensor, the insulation film (gate insulation film) 21 covering the surface of the light receiving area is removed after the gate electrode process by wet etching or the like. Then, insulation film 23 formed of a thermal-oxidation film is formed so as to cover the surface of the silicon substrate 11. Then, the ion implantation is performed with having the insulation film 23 as an implantation protection film to form the n-type high concentration diffusion regions 16 on the surface of the light receiving diode 1. Thus, the insulation film 23 covering the light receiving area has the film thickness variance extremely smaller than the film thickness variance of the gate insulation film generated by remaining the gate insulation film when the gate electrode 22 is processed. Further, the film thickness itself of the insulation film 23 can be made smaller compared to the conventional techniques. Accordingly, the variance in the surface leak current generated due to the variance in the ion reaching depth when ions are implanted can be minimized.

Moreover, the insulation film 23 can also serve as a film which alleviates plasma damage of the light receiving area during the process of the gate electrode 22. Thus, the surface leak current due to surface defects on the surface of the light receiving diode 1 can be reduced.

Furthermore, by setting the implantation average range of the ion implantation impurities to be within the insulation film 23 when the n-type high concentration diffusion regions 16 are formed on the surface of the light receiving diode 1, defects generated by implanting ions into the light receiving area can be reduced. Further, it becomes possible to provide impurity concentration gradient from the upper-most surface of the silicon substrate 11 in the depth direction of the silicon substrate 11. Thus, the surface generated leak current due to the n-type high concentration diffusion regions 16 can be reduced in the upper-most surface of the silicon substrate 11. The sensitivity to the blue light of short wave length can be improved in the n-type high concentration diffusion regions 16 which are deeper than the upper-most surface of the silicon substrate 11.

The present invention is not limited to the above-described embodiment. The conductive types of the layers and the regions as described in the above embodiment may be all reversed to form such layers and regions on an n-type substrate in order to achieve similar effects.

The present invention has been described above with reference to the preferable embodiment of the present invention. However, the present invention should not be construed as being limited to such an embodiment. It should be recognized that the scope of the present invention is only construed by the claims. It should be recognized that those skilled in the art can implement the equivalent scope from the descriptions of the specific preferable embodiment, based on the descriptions of the present invention and common technical knowledge. It is also recognized that the patents, patent applications and documents referred herein are hereby incorporated by reference as if their entirety are described.

The present invention allows reducing generation of defects due to ion implantation in light receiving areas and reducing a surface leak current due to surface defects on a surface of the light receiving areas in the field of solid-state image sensors such MOS-type image sensors of threshold voltage modulation type which are used in, for example, video cameras, digital cameras, cell phones with built-in cameras and the like, and a fabrication method thereof. Since the solid-state image sensor according to the present invention has superior photo diode properties, they can be widely used in electronic information equipment which can utilize solid-state image sensors, such as video cameras, digital cameras, cell phones with built-in cameras and the like.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image sensor in which a plurality of unit pixel portions, each including a light receiving area which generates electric charges by light irradiation and a transistor which outputs an electric signal in accordance with the light receiving area, are arranged in a two-dimensional array, wherein:

each of the unit pixel portions is separated from each of the unit pixel portions adjacent thereto in said two-dimensional array by pixel separation electrodes and by a second conductivity type semiconductor portion, each of the unit pixel portions includes a first conductivity type well region, said two-dimensional array and said second conductivity type semiconductor portion separating the unit pixels of said two-dimensional array are provided on a second conductivity type semiconductor layer located within a substrate, such that a part of the first conductivity type well region and a second conductivity type semiconductor region laminated on a part of said first conductivity type well region form the light receiving areas, wherein the substrate has a bottom portion of the first conductivity type;

the solid-state image sensor comprises an insulation film formed of a thermal oxidation film so as to cover a top surface region of the substrate and a top surface of a gate of the transistor, wherein the second conductivity type semiconductor region is formed in the top surface region of the substrate;

an electric charge storage area for storing electric charges generated in the light receiving area is provided in the first conductivity type well region whereby said transistor can read out an electric signal in accordance with an amount of electric charges stored in the electric charge storage area;

the second conductivity type semiconductor region is formed through an impurity implantation and has a maximum impurity concentration portion at a surface thereof that is opposite to said first conductivity type well region; and a peak impurity concentration caused by the impurity implantation is located within the insulation film such that an average depth of the impurity implantation is located within the insulation film.

2. A solid-state image sensor according to claim 1, wherein the peak impurity concentration is set to be about $6 \times 10^{18}$ cm$^{-3}$ so that the average depth of the impurity implantation is within the insulation film.

3. A solid-state image sensor according to claim 1, wherein the insulation film has a film thickness set to 200 angstroms.

4. A solid-state image sensor according to claim 1, wherein the transistor is a MOS-transistor.

* * * * *